（12）United States Patent
Hase

(10) Patent No.: US 7,251,014 B2
(45) Date of Patent: Jul. 31, 2007

(54) EXPOSING METHOD, EXPOSING APPARATUS AND DEVICE MANUFACTURING METHOD UTILIZING THEM

(75) Inventor: Tomoharu Hase, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 226 days.

(21) Appl. No.: 10/998,905

(22) Filed: Nov. 30, 2004

(65) Prior Publication Data

US 2005/0122492 A1 Jun. 9, 2005

(30) Foreign Application Priority Data

Dec. 3, 2003 (JP) ............... 2003-403948

(51) Int. Cl.
*G03B 27/32* (2006.01)
*G03B 27/52* (2006.01)

(52) U.S. Cl. .......................... 355/30; 355/77
(58) Field of Classification Search ............ 355/30, 355/53, 67, 77
See application file for complete search history.

(56) References Cited

U.S. PATENT DOCUMENTS 6,252,648 B1 6/2001 Hase et al.
6,571,057 B2 * 5/2003 Aoki ....................... 396/53

FOREIGN PATENT DOCUMENTS

| JP | 2000-082856 | 3/2000 |
| JP | 2000-126704 | 5/2000 |
| JP | 2001-274070 | 10/2001 |
| JP | 2001-296417 | 10/2001 |
| JP | 2003-344601 | 12/2003 |

* cited by examiner

*Primary Examiner*—Rodney Fuller
(74) *Attorney, Agent, or Firm*—Fitzpatrick, Cella, Harper & Scinto

(57) ABSTRACT

An exposing method which can effect the cleaning of an optical element so that throughput may not be substantially reduced when exposure using ultraviolet light is effected. The exposing method applies ultraviolet light emitted from a light source to an object to be exposed through a first isolated chamber including an optical surface, and a second isolated chamber including an optical surface to thereby expose the object to be exposed by the light. The method includes a first cleaning step of supplying a cleaning gas to the first isolated chamber to thereby clean the optical surface included in the first isolated chamber, and a second cleaning step of supplying a cleaning gas to the second isolated chamber to thereby clean the optical surface included in the second isolated chamber, wherein the start of the first cleaning step is later than the start of the second cleaning step.

19 Claims, 6 Drawing Sheets

EXPOSING METHOD, EXPOSING APPARATUS AND DEVICE MANUFACTURING METHOD UTILIZING THEM

BACKGROUND OF THE INVENTION

1. Field of the Invention

This invention generally relates to a cleaning method, and particularly to a method of cleaning optical members such as a lens and a mirror used in an exposing apparatus for manufacturing a device such as a single crystal substrate for a semiconductor wafer or a glass substrate for a liquid crystal display. However, the use of the cleaning method of the present invention is not restricted to the exposing apparatus, but the cleaning method of the present invention can be widely applied to photolithography, projection inspection and optical apparatuses such as a motion picture projector and other projectors.

2. Related Background Art

When manufacturing a minute semiconductor element such as a semiconductor memory or a logic circuit by the use of photolithography technique, use has heretofore been made of a reduction projection exposing apparatus for projecting a circuit pattern depicted on a reticle (or a mask) onto a wafer or the like by a projection optical system to thereby transfer the circuit pattern.

The minimum dimension (resolution) which can be transferred by the reduction projection exposing apparatus is proportional to the wavelength of light used for exposure, and is inversely proportional to the numerical aperture (NA) of the projection optical system. Accordingly, the shorter the wavelength is made, the better the resolution. Therefore, with the requirement for the minuteness of semiconductor elements in recent years, the shorter wavelength of exposure light has been advanced, and an exposure light source has shifted from a super-high pressure mercury lamp (i-line (a wavelength of about 365 nm)) to a KrF excimer laser (a wavelength of about 248 nm) and an ArF excimer laser (a wavelength of about 193 nm), and further, it has been advanced to put an $F_2$ laser (a wavelength of about 157 nm) into practical use.

Light of a wavelength of about 200 nm or shorter becomes very great in light absorption by substances (hereinafter referred to as the "light absorbing substances") such as oxygen molecules, water molecules and carbon dioxide molecules contained in an optical path atmosphere. Particularly, the ArF laser, the $F_2$ laser, etc. are remarkable in the light absorption by the light absorbing substances, and the transmittance thereof is generally represented by the following mathematical expression 1.

Transmittance=exp−(absorption coefficient)×density [ppm]×distance [cm] (atmospheric pressure/atm)   [Mathematical Expression 1]

absorption coefficient oxygen: 190 water: 62 carbon dioxide: 9

Therefore, in an exposing apparatus using vacuum ultraviolet light, in order to prevent a reduction in an exposure amount to an object to be processed, an optical member disposed in an optical path is contained in a space purged (or made vacuum) by an inert gas. In an exposing apparatus using an $F_2$ laser as a light source, in order to enable sufficient transmittance to be obtained, it becomes necessary to make the density of the light absorbing substances in an optical path equal to or less than about 1 ppm, and the purge time required for this is shown by the following mathematical expression 2, and a long time and a great deal of inert gas are required to make the light absorbing substances have desired density. So, in order to curtail the purge time and the inert gas required, it has been proposed to divide the space to be purged into isolated chambers, and effect the purge in each isolated chamber.

Purge time=purge volume [1]/flow rate of inert gas [1/min]×360 min. to 480 min. or longer   [Mathematical Expression 2]

Also, n an exposing apparatus using a KrF excimer laser, photon energy becomes great and causes impurities and oxygen in an optical path to photochemically react to each other. If a product formed by the photochemical reaction adheres to an optical member, it clouds the optical element, thus resulting not only a further reduction in the exposure amount, but also the deterioration of imaging performance. The impurities include, for example, a halide such as a plasticizer contained in an electric wire coating substance in the optical path, and organic substances or the like contained in working oil, an adhesive agent, etc.

So, in the exposing apparatus, use is made of a non-metal member small in degassing property or a metal member of small surface roughness from which the working oil has been completely removed by ultrasonic cleaning or the like. However, it is not easy to completely remove the impurities, and since clouding occurs to the optical member even during the assembly of the apparatus or during exposure, the cleaning of the optical member after assembly is very important.

The use of plasma, a neutral detergent and organic and inorganic solvents has already been proposed as the cleaning method for the optical member, and in recent years, attention has been paid to light cleaning using ozone for higher cleaning ability. The light cleaning applies ultraviolet light to an optical member to thereby decompose a substance adhering to the optical member. The ultraviolet light produces active oxygen in oxygen gas and activates the substance adhering to the surface of the optical member. Ozone is produced from the active oxygen and oxygen molecules, and when the ozone receives ultraviolet light, they change into active oxygen in its excited state, and decompose and volatilize the substance adhering to the optical member. It is known that the light cleaning becomes low in effectiveness when oxygen molecules are absent.

That is, in the case of vacuum ultraviolet light, to effect exposure with a sufficient exposure amount, the elimination of oxygen molecules which are a light absorbing substance is necessary. On the other hand, in case of light cleaning, there occurs the contradiction that oxygen molecules are necessary. Particularly, in an exposing apparatus using an ArF laser or an $F_2$ laser as a light source, when oxygen or ozone for light cleaning is supplied into an optical path, the laser beam is absorbed by such oxygen or ozone, and this may lead to a case where the laser beam does not reach an optical member at a succeeding stage and therefore light cleaning is not effected. Also, in order to eliminate the oxygen or ozone supplied during the light cleaning, it is necessary to effect the purge of inert gas, and this requires very much time, thus resulting in a remarkable reduction in throughput.

SUMMARY OF THE INVENTION

So, the present invention has as its object to provide an exposing apparatus and a cleaning method which make the cleaning of an optical member possible even when vacuum ultraviolet light is used, and prevent reductions in throughput and imaging performance.

In order to achieve the above object, an exposing method as one aspect of the present invention is an exposing method of applying ultraviolet light emitted from a light source to an object to be exposed through a first isolated chamber including an optical surface, and a second isolated chamber including an optical surface to thereby expose the object to be exposed by the light, having a first cleaning step of supplying a cleaning gas to the first isolated chamber to thereby clean the optical surface included in the first isolated chamber, and a second cleaning step of supplying a cleaning gas to the second isolated chamber to thereby clean the optical surface included in the second isolated chamber, wherein the start of the first cleaning step is later than the start of the second cleaning step.

Furthermore, an exposing apparatus as one aspect of the present invention is an exposing apparatus for applying ultraviolet light emitted from a light source to an object to be exposed through a first isolated chamber including, an optical surface and a second isolated chamber including an optical surface to thereby expose said object to be exposed with the light, having: first cleaning means for supplying a cleaning gas to said first isolated chamber to thereby clean the optical surface included in said first isolated chamber; and second cleaning means for supplying a cleaning gas to said second isolated chamber to thereby clean the optical surface included in said second isolated chamber, wherein timing at which the cleaning by said second cleaning means is started is later than timing at which the cleaning by said first cleaning means is started.

Also, a device manufacturing method as one aspect of the present invention is provided with an exposing step of exposing the object to be exposed on the basis of the aforedescribed exposing method or by the use of the aforedescribed exposing apparatus, and a step of developing the exposed object to be exposed.

DESCRIPTION OF THE PREFERRED EMBODIMENTS

Figure 1:
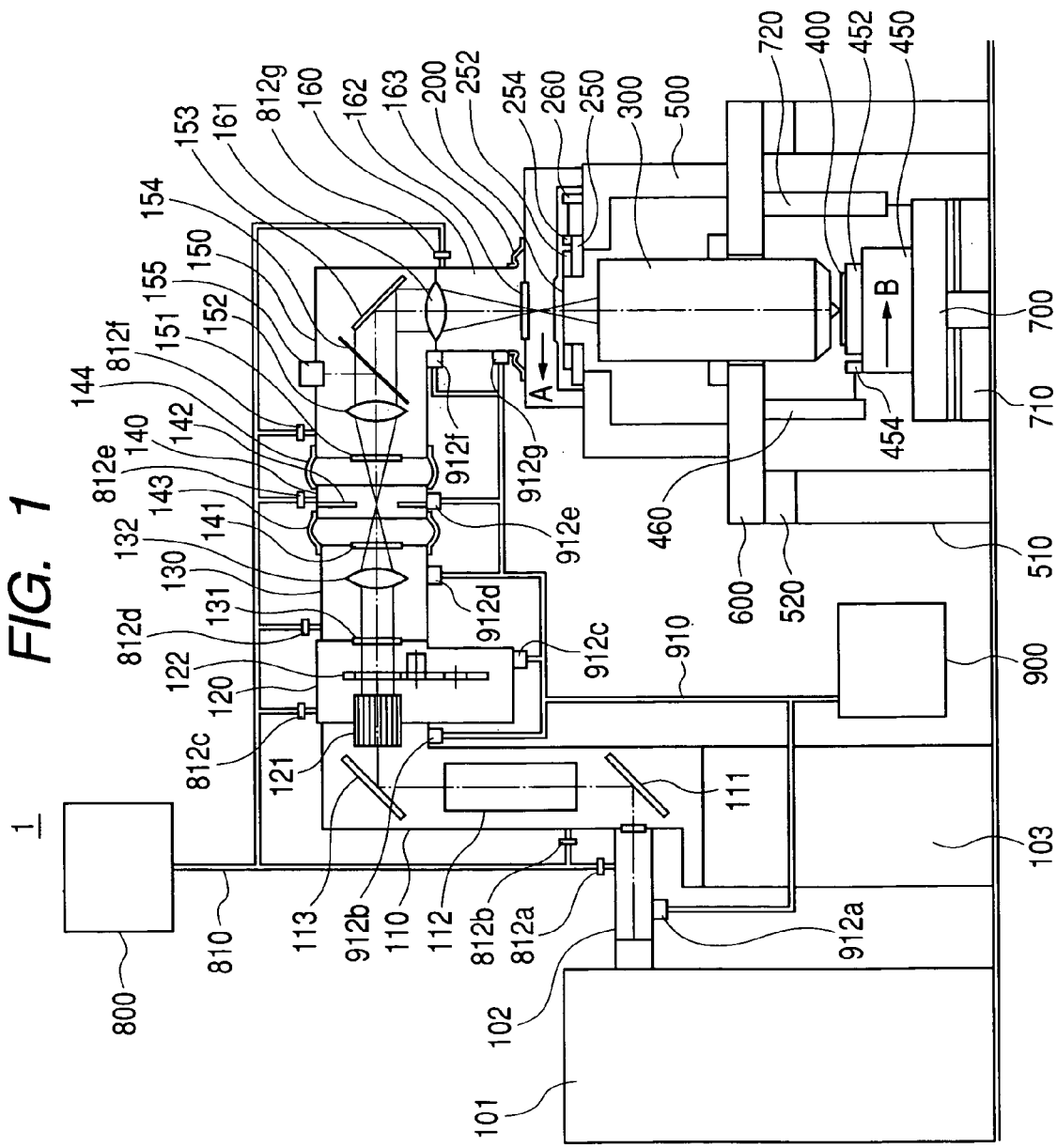
FIG. 1 is a schematic cross-sectional view showing the construction of the exposing apparatus of the present invention.

An exposing apparatus as one aspect of the present invention will hereinafter be described with reference to the accompanying drawings. FIG. 1 is a schematic cross-sectional view showing the construction of the exposing apparatus 1 of the present invention. In respective figures, the same reference numerals designate the same members and overlapping descriptions will be omitted.

The exposing apparatus 1 has an illuminating optical system comprised of optical members contained in a first chassis (the chassis herein referred to means a space having an inlet port and an exhaust port, but substantially hermetically sealed, and this hermetically sealed space includes at least one optical surface) 110 to a sixth chassis 160, and has an illuminating apparatus for illuminating a reticle 200, a reticle stage 250 on which the reticle 200 is placed, a projection optical system 300 for projecting diffracted light produced from the illuminated reticle 200 onto a plate 400, a plate stage 450 on which the plate (such as a plate, a substrate or a wafer to which resist or the like is applied) 400 is placed, inert gas supplying means 800 and cleaning gas supplying means 900. The exposing apparatus 1 can effectively effect light cleaning and can minimize the time required for the restoration of the apparatus after the light cleaning even when use is made of vacuum ultraviolet light of a wavelength of 200 nm or shorter (more preferably a wavelength of 160 nm or shorter, or further a wavelength of 100 nm or greater) remarkable in the absorption by oxygen or ozone, such as an $F_2$ laser (or an ArF laser).

The exposing apparatus 1 is a projection exposing apparatus which exposes a circuit pattern formed on the reticle 200, for example, by a step-and-repeat process or a step-and-scan process to the plate 400. Such an exposing apparatus is suitable for a lithography step of a submicron or a quarter micron or less, and in the present embodiment, description will hereinafter be made with an exposing apparatus of the step-and-scan type (called also a "scanner") as an example. Here, the "step-and-scan process" is an exposing method of continuously scanning (or simply moving) a wafer relative to a reticle and exposing the wafer to a reticle pattern, and step-moving the wafer after the termination of one shot of exposure to thereby move it to the next exposing area. The "step-and-repeat process" is an exposing method of step-moving a wafer at each collective exposure of the wafer to thereby move it to the next shot exposing area.

In the present embodiment, a light source portion 101 is an $F_2$ laser having a wavelength of about 157 nm, and effects pulse light emission. The light source portion 101, however, is not restricted to the $F_2$ laser, but may be ultraviolet light usable for light cleaning which will be described later, for example, an ArF excimer laser of a wavelength of about 193 nm, a KrF excimer laser of a wavelength of about 248 nm, or the like. Also, in a case where a light source for light cleaning is discretely provided, it is of course unnecessary to use ultraviolet light as the light source portion 101.

A laser beam from the light source portion 101 is reflected by a mirror 111 contained in the first chassis 110 placed on a stand 103 through a led-about optical system 102 and enters a shaping optical system 112. The laser beam shaped into a predetermined beam shape via the shaping optical system 112 is reflected by a mirror 113 and enters an optical integrator 121.

The optical integrator 121 forms a secondary light source and also has the function as an incidence window to the second chassis 120 (the emergence window of the first chassis 110). A stop 122 contained in the second chassis 120 for intercepting unnecessary light from the secondary light source and forming a desired effective light source is changeably over disposed near the emergence surface of the optical integrator 121.

Light from the secondary light source formed by the optical integrator 121 passes through the incidence window 131 of the third chassis 130 (the emergence window of the second chassis 120), and is condensed by a condensing lens 132 contained in the fourth chassis 140. The light condensed by the condensing lens 132 passes through the incidence window 141 of the fourth chassis (the emergence window of the third chassis) and enters a variable blind 142 contained in the fourth chassis 140.

Figure 2:
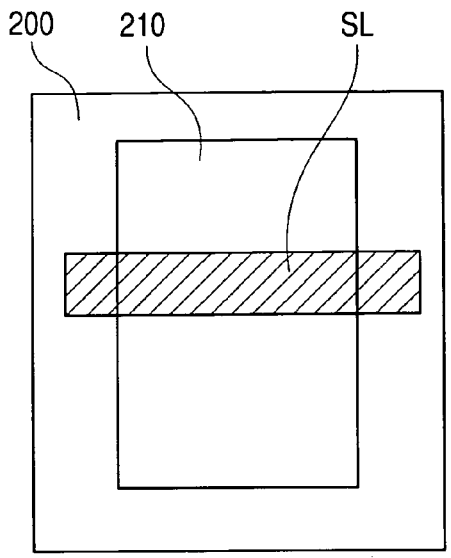
FIG. 2 is a schematic plan view showing a reticle illuminated in an illuminating area set by a variable blind shown in FIG. 1.

The variable blind 142 has a light intercepting plate disposed near a plane in a direction orthogonal to an optical axis containing a condensing point formed by the condensing lens 132, and enables the illuminated area of the pattern surface of the reticle 200 to be arbitrarily set. An example of a state in which the reticle 200 is illuminated is shown in FIG. 2. Referring to FIG. 2, a portion of a pattern 210 formed on the reticle 200 is slit-illuminated by a slit-shaped beam SL set by the variable blind 142.

The light from the variable blind 142 passes through the incidence window 151 of the fifth chassis 150 (the emergence window of the fourth chassis 140) and is condensed by a condensing lens 152 contained in the fifth chassis 150, and is reflected by a mirror 153. The light reflected by the mirror 153 is condensed by a condensing lens 161 which serves also as the incidence window 161 of the sixth chassis 160 (the emergence window of the fifth chassis 150), and passes through an emergence window 162 and illuminates the reticle 200.

The reticle 200 is slit-illuminated as described above, and a portion of the pattern 210 is reduction-projected onto the plate 400 by the projection optical system 300. At this time, multi-pulse exposure by the pulse light emission from the light source portion 101 is repeated while in the direction of arrows A and B indicated in FIG. 1, the reticle 200 and the plate 400 are scanned relative to the projection optical system 300 and the slit-shaped beam SL at the same speed ratio as the reduction magnification ratio of the projection optical system 300 so as to be opposite in direction to each other. Thereby, the pattern 210 on the whole surface of the reticle 200 is transferred to a one-chip area or a plural-chip area on the plate 400. In the present embodiment, the plate 400 is a wafer, but widely includes a liquid crystal substrate and other object to be cleaned, and has photoresist applied thereto.

Also, a half-mirror 154 is disposed in the optical path, and in the present embodiment, it is contained in the fifth chassis 150. The half-mirror 154 directs part of the illuminating light to a photoelectric sensor 155 for detecting the quantity of light, and on the basis of the result of the detection by the photoelectric sensor 155, the output of the light source portion 101 is adjusted so that the exposure amount at each shot may assume a desired value.

The reticle stage 250 holds the reticle 200 through a reticle chuck 252, and scan-drives the reticle 200 in the direction of arrow A indicated in FIG. 1 by driving means, not shown. Also, a bar mirror 254 is fixed to the reticle stage 250, and a laser interferometer 260 can detect the speed of the reticle stage 250 by the bar mirror 254.

The reticle stage 250 and the laser interferometer 260 are placed on a fixed supporting board 500. The fixed supporting board 500 is fixed onto a fixed barrel board 600 holding the projection optical system 300 on a floor through a column 510 and a damper 520.

The plate stage 450 holds the plate 400 through a plate chuck 452, and scan-drives the plate 400 in the direction of arrow B indicated in FIG. 1 by driving means, not shown. Also, a bar mirror 454 is fixed to the plate stage 450, and a laser interferometer 460 can detect the speed of the plate stage 450 by the bar mirror 454.

The plate stage 450 is placed on a fixed stage board 700 to the floor through a damper 710. Further, the vertical relative distance between the fixed barrel board 600 and the fixed stage board 700 is measured by a laser interferometer 720 fixed to the fixed barrel board 600. Thus, the positional relation between the fixed barrel board 600 and the plate stage 450, in other words, the relative positional relation between the reticle 200 and the plate 400 is ensured by the laser interferometers 460 and 720.

The first chassis 110 to the sixth chassis 160 have hermetically sealed structure. The fourth chassis 140 containing the variable blind 142 therein have individual supporting stands, not shown, in order to be independent of the vibration by the driving of the variable blind 142, and is connected to the third chassis 130 and the fifth chassis 150 by hermetically sealing members 143 and 144 formed of e.g. fluorine rubber. Also, the sixth chassis 160 is connected to the reticle stage 250 by a hermetically sealing member 163 formed of e.g. fluorine rubber in order to be separated in vibration from the reticle stage 250 of which highly accurate position control is required.

Inert gas supplying means 800 for supplying an inert gas is connected to the first chassis 110 to the sixth chassis 160 through supplying piping 810. As the inert gas, mention may be made, for example, of nitrogen, helium or the like. While in the present embodiment, the supplying piping 810 is metal piping formed of a metal, use may be made of piping of fluorine resin which is small in the amount of transmission of oxygen and moisture. Also, exhaust means, not shown, is connected to the first chassis 110 to the sixth chassis 160 through exhaust piping, not shown.

Electromagnetic valves, not shown, are provided between each of the first chassis 110 to the sixth chassis 160 and the supplying piping 810 and between each of the chassis and the exhaust piping, and by the electromagnetic valves provided in the supplying piping 810 and the electromagnetic valves provided in the exhaust piping being opened, the supply of the inert gas to the first chassis 110 to the sixth chassis 160 and the evacuation of the first chassis 110 to the sixth chassis 160 are effected. Thereby, the first chassis 110 to the sixth chassis 160 permit the supply and exhaust of the inert gas independently of one another. Check valves 812a to 812g are provided between the first chassis 110, the second chassis 120, the third chassis 130, the fourth chassis 140, the fifth chassis 150, the sixth chassis 160 and the supplying piping 810 to thereby prevent the supplied inert gas from flowing back and getting mixed in other chassis.

The exposing apparatus 1 of the present invention further has cleaning gas supplying means 900 for supplying a cleaning gas for cleaning the optical members contained in the first chassis 110 to the sixth chassis 160 to the first chassis 110 to the sixth chassis 160. The cleaning gas supplying means 900 is connected to the first chassis 110 to the sixth chassis 160 through supplying piping 910. As the cleaning gas, mention may be made, for example, of oxygen, ozone or the like. In the present embodiment, the supplying piping 910, like the supplying piping 810, is formed of a metal.

Electromagnetic valves 912a to 912g are provided between the first chassis 110 to the sixth chassis 160 and the supplying piping 910, and by the electromagnetic valves 912a to 912g being opened, the supply of the cleaning gas to the first chassis 110 to the sixth chassis 160 is effected. Thereby, the cleaning gas can be supplied to the first chassis 110 to the sixth chassis 160 independently of one another, and it is made possible to effect the light cleaning of each chassis.

Figure 3:
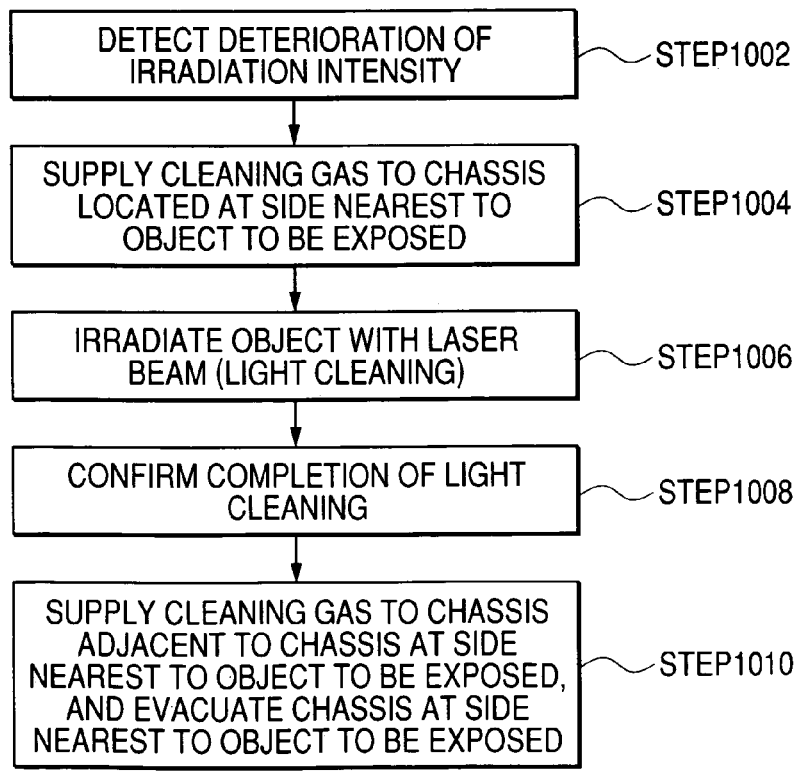
FIG. 3 is a flow chart for illustrating the light cleaning method of the present invention.

The light cleaning method 1000 of the present invention will hereinafter be described with reference to FIG. 3. The light cleaning method 1000 can effectively effect light cleaning in an exposing apparatus using vacuum ultraviolet light such as an $F_2$ laser as a light source. FIG. 3 is a flow chart for illustrating the light cleaning method of the present invention.

When the deterioration of irradiation intensity is first detected by a photoelectric sensor 155 (step 1002), the cleaning gas (oxygen) is supplied to the chassis located at the side nearest to the plate 400, in the present embodiment, the sixth chassis 160 (step 1004).

The amount of the cleaning gas supplied should preferably be set in such a manner that the laser beam reaches the optical member disposed at the rearest stage of each chassis. When for example, oxygen is used as the cleaning gas, if the laser beam travels by 50 cm in an atmosphere of oxygen density 100 ppm, transmittance becomes 38.7% and therefore, generally, the supply of oxygen can be effected to a chassis of which the optical path length is 30 cm to 50 cm in such a manner that oxygen density becomes 100 ppm or less (or ozone density becomes 50 ppm or less). Here, preferably, oxygen density should be 3 ppm or greater (ozone density should be 2 ppm or greater). Specifically, the supply of the inert gas to the sixth chassis 160 is stopped, and oxygen is supplied within such a range that oxygen density becomes 100 ppm or less. Adjustment may be effected in advance so that gas of oxygen density 100 ppm may be supplied, and such a gas may be supplied instead of the inert gas for a predetermined time. Actually, however, it is also necessary to consider the transmittance of the optical members contained in the chassis.

When the density of the cleaning gas for the sixth chassis 160 reaches a desired value, the supply of the cleaning gas (oxygen) is stopped. Then, the application of the laser beam is effected in a state in which the inert gas and a slight amount of oxygen get mixed in the sixth chassis 160 (step 10006). Thus, oxygen in the inert gas filling the sixth chassis 160 is converted into ozone by photochemical reaction, and in such a state, the application of the laser beam is further continued, whereby an organic compound (cloudiness) adhering onto the optical members (in the present embodiment, an incidence window 161 and an emergence window 162) such as a lens, a mirror and a window contained in the sixth chassis 160 is oxidated. That is, the cloudiness on the optical members contained in the sixth chassis 160 is removed by light cleaning. Not oxygen, but ozone may be directly supplied.

Next, it is confirmed that the light cleaning of the sixth chassis 160 has been completed (step 1008). The confirmation of the completion of the light cleaning is effected on the basis of the time for which the light cleaning has been effected, i.e., the time for which the laser beam continues to be applied after oxygen has been supplied to the sixth chassis 160. When the light cleaning of the sixth chassis 160 is completed, the cleaning gas is supplied to the fifth chassis 150 to thereby effect light cleaning and also, the exhaust of the cleaning gas supplied to the sixth chassis 160 is effected (step 1010). Thereafter, the inert gas is continuously or intermittently supplied to the sixth chassis 160 until the laser beam is recovered to a state in which it can be transmitted at high transmittance (that is, a state in which exposure is possible).

These steps are repeated up to the first chassis to thereby effect light cleaning and also, the evacuation of the chassis of which the light cleaning has been completed and the supply of the inert gas thereto are effected in parallel therewith. The flow of the light cleaning and inert gas purge of the sixth chassis 160 to the fourth chassis 140 is typically shown in FIG. 4. Although in FIG. 4, the flow is up to the fourth chassis 140, of course actually the light cleaning and inert gas purge are effected up to the first chassis 110. However, it is not necessary to effect the light cleaning of all of the first to sixth chassis, but of these chassis (or substantially hermetically sealed spaces), only the chassis which requires the light cleaning may be selected and subjected to the light cleaning. Here, the chassis which requires the light cleaning may be a chassis including therein an optical element or an optical element surface about which it is grasped in advance that the possibility of being contaminated is high or the speed at which it is contaminated is high, or provision may be made of a sensor which can examine the light transmittance (the degree of contamination) of an optical element surface included in each chassis, and depending on the result of the output of the sensor, a chassis including an optical element surface which is low in light transmittance (high in the degree of contamination) may be selectively subjected to the light cleaning.

Figure 4:
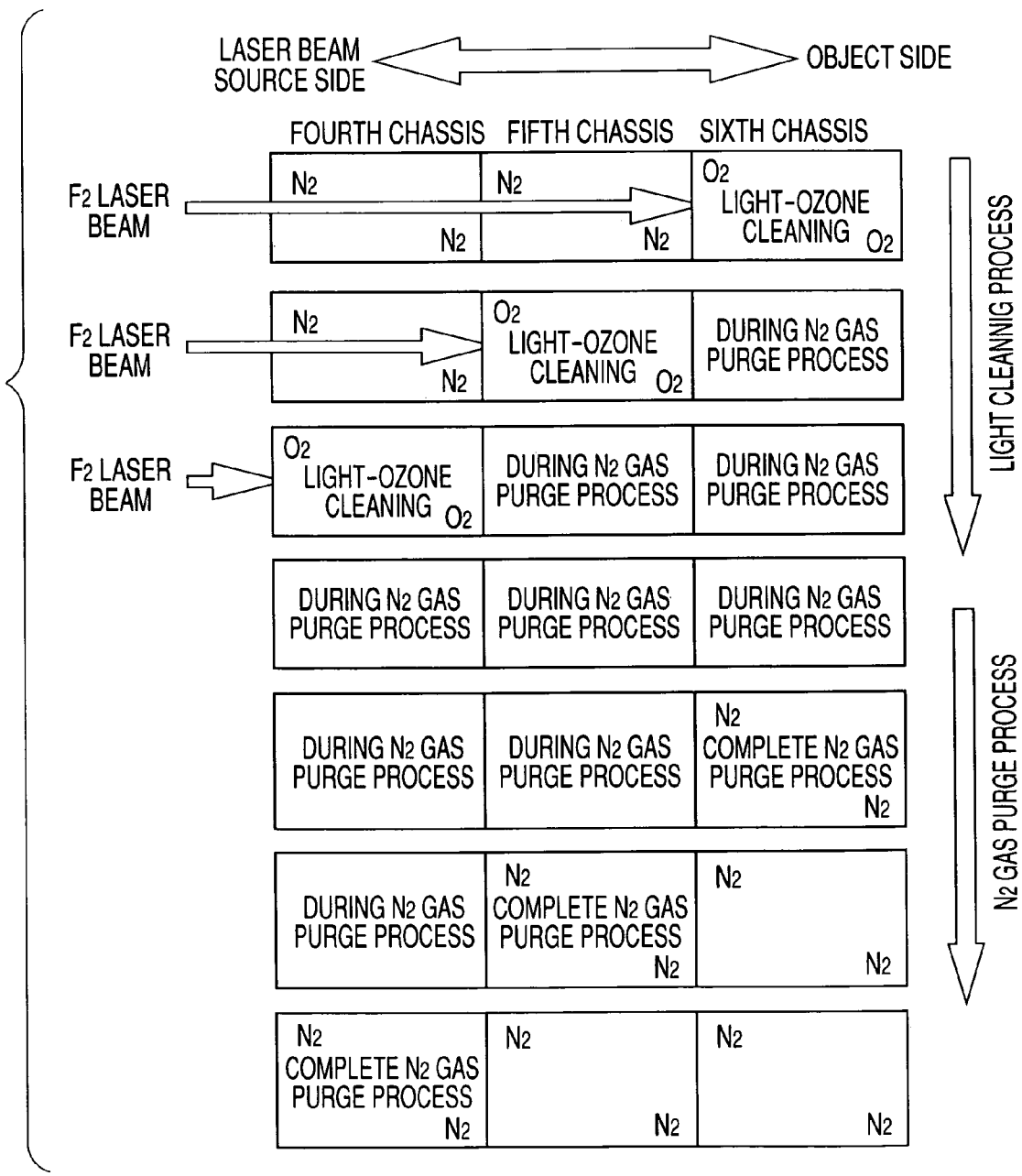
FIG. 4 typically shows the process of light cleaning and inert gas purge.

Referring to FIG. 4, the light cleaning is effected on the sixth chassis 160 at the side nearest to the object to be exposed to the chassis on the light source side (i.e., the fifth chassis 150 to the first chassis 110) in succession, whereby any reduction in throughput can be prevented. Particularly, a cleaning gas absorbing the laser beam is supplied from the chassis on the object to be exposed side, whereby the laser beam reaches the chassis on the light source side which is adjacent to such a chassis. Accordingly, after the light cleaning of a chassis, the light cleaning of the next chassis can be immediately begun. If conversely, the light cleaning is begun from the chassis on the light source side, the laser beam does not reach the chassis succeeding to such a chassis and therefore, after the light cleaning of the chassis on the light source side, the evacuating time must be waited for until the laser beam is transmitted through such a chassis, and this results in a reduction in throughput. The light cleaning, if effected during the standby of the exposing apparatus, will not affect the throughput and therefore, this is preferable. Here, there are two chassis called the chassis on the object to be exposed side and the chassis on the light source side (the light source referred to here can be a light source for light cleaning, and need not always be a light source for exposure), and it will suffice if the start of the light cleaning of the chassis on the object to be exposed side (the start of the supply of the cleaning gas to the chassis on the object to be exposed side) takes place earlier than the start of the light cleaning of a chassis disposed nearer to the light source side than that chassis. Of course, as previously described, it is desirable to effect the light cleaning of the chassis on the light source side after the completion of the light cleaning of the chassis on the object to be processed side, but this is not restrictive. For example, at the same time of evacuating the cleaning gas (or lowering the concentration of the cleaning gas, diluting the cleaning gas) in the chassis on the object to be processed side, the cleaning gas may be applied into the chassis on the light source side, the light cleaning of the chassis on the light source side may be effected, or the cleaning gas in the chassis on the light source side may be evacuated.

According to the exposing apparatus 1 and the cleaning method 1000 of the present invention, even when vacuum ultraviolet light is used, the cleaning of the optical members becomes possible and the reduction in imaging performance due to the clouding of the optical members can be prevented. Also, the time required for such cleaning can be minimized, and any reduction in throughput is prevented. While in the present embodiment, the illuminating optical system is divided into six by the first chassis 110 to the sixth chassis 160, the number of divisions may be two or three, or may of course be any number. However, a greater number of divisions makes the volume of a chassis smaller and therefore, makes the time required for inert gas purge shorter, and can further suppress the reduction in throughput and thus, it is desirable that the space from the light source to the plate (a member to be exposed, a substrate, a wafer) to which resist is applied be divided into three or more, preferably six or more spaces (chassis) and they be designed to be light-cleaned from the plate side.

Figure 5:
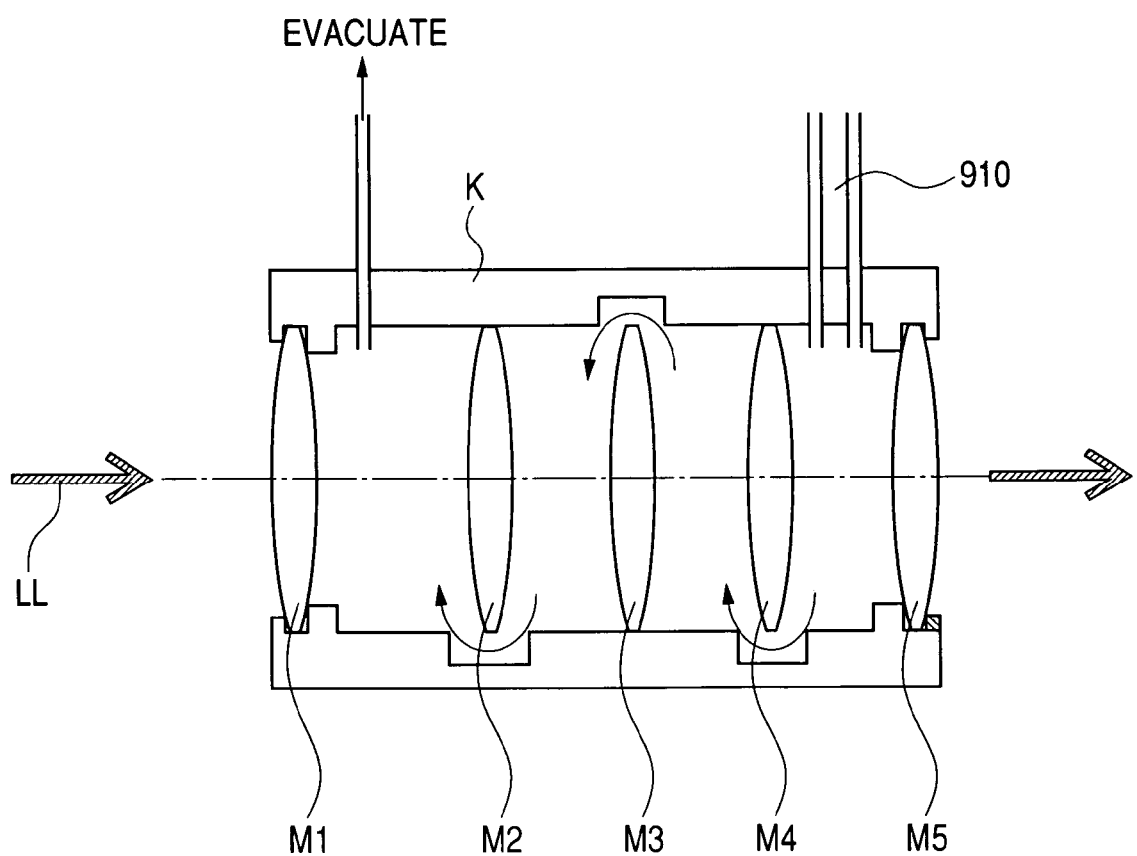
FIG. 5 is a schematic cross-sectional view showing an example of the arrangement of the supply pipe of cleaning gas supplying means and an optical member in a chassis shown in FIG. 1.

At the step 1004, it is very difficult to supply oxygen so as to assume slight oxygen density and therefore, as shown in FIG. 5, provision may be made of supplying piping 910 connecting cleaning gas supplying means 900 and the chassis together so as to supply the cleaning gas to the surroundings of an optical member M5 disposed nearest to the emergence side of a laser beam LL. Also, optical members M1 to M4, like the optical member M5, are supported by a chassis K. The optical members M2 to M4 are supported with gaps provided with respect to the chassis so that the cleaning gas supplied to the surroundings of the optical member M5 may flow to the surroundings of the optical member M1. It is desirable that the position (direction) of the gap provided between the optical member M2 and the chassis in the direction of rotation of the center of the optical axis and the position (direction) of the gap provided between the optical member M3 and the chassis in the direction of rotation of the center of the optical axis differ from each other, and further, it is desirable that the position (direction) of the gap provided between the optical member M3 and the chassis in the direction of rotation of the center of the optical axis and the position (direction) of the gap provided between the optical member M4 and the chassis in the direction of rotation of the center of the optical axis differ from each other. The manner of deviation between those positions should desirably be about 180 degrees (165–195 degrees) when with respect to each optical member, a gap is provided between the optical member and the chassis, and should be about 90 degrees (75–105 degrees) when two gaps are provided between the optical member and the chassis (the positions of these two gaps deviate by about 180 degrees from each other), and should be about 60 degrees (45–75 degrees) when three gaps are provided between the optical member and the chassis (the positions of these three gaps deviate by about 120 degrees from one another). Here, the position (direction) of the gap provided between the optical member M2 and the chassis in the direction of rotation of the center of the optical axis and the position (direction) of the gap provided between the optical member M4 and the chassis in the direction of rotation of the center of the optical axis may or may not coincide with each other, but may preferably coincide with each other. Thereby, the light cleaning is first effected near the optical member M5, and then the light cleaning of the optical members M4 to M1 on the incidence side of the laser beam LL is sequentially effected. The light cleaning is effected from the optical member M5 disposed nearest to the emergence side of the laser beam LL and therefore, it is not necessary to consider the arrival of the laser beam LL in particular. Here, FIG. 5 is a schematic cross-sectional view showing an example of the arrangement of the supplying piping 910 of the cleaning gas supplying means 900 shown in FIG. 1 and the optical members M1 to M5 in the chassis K.

Figure 6:
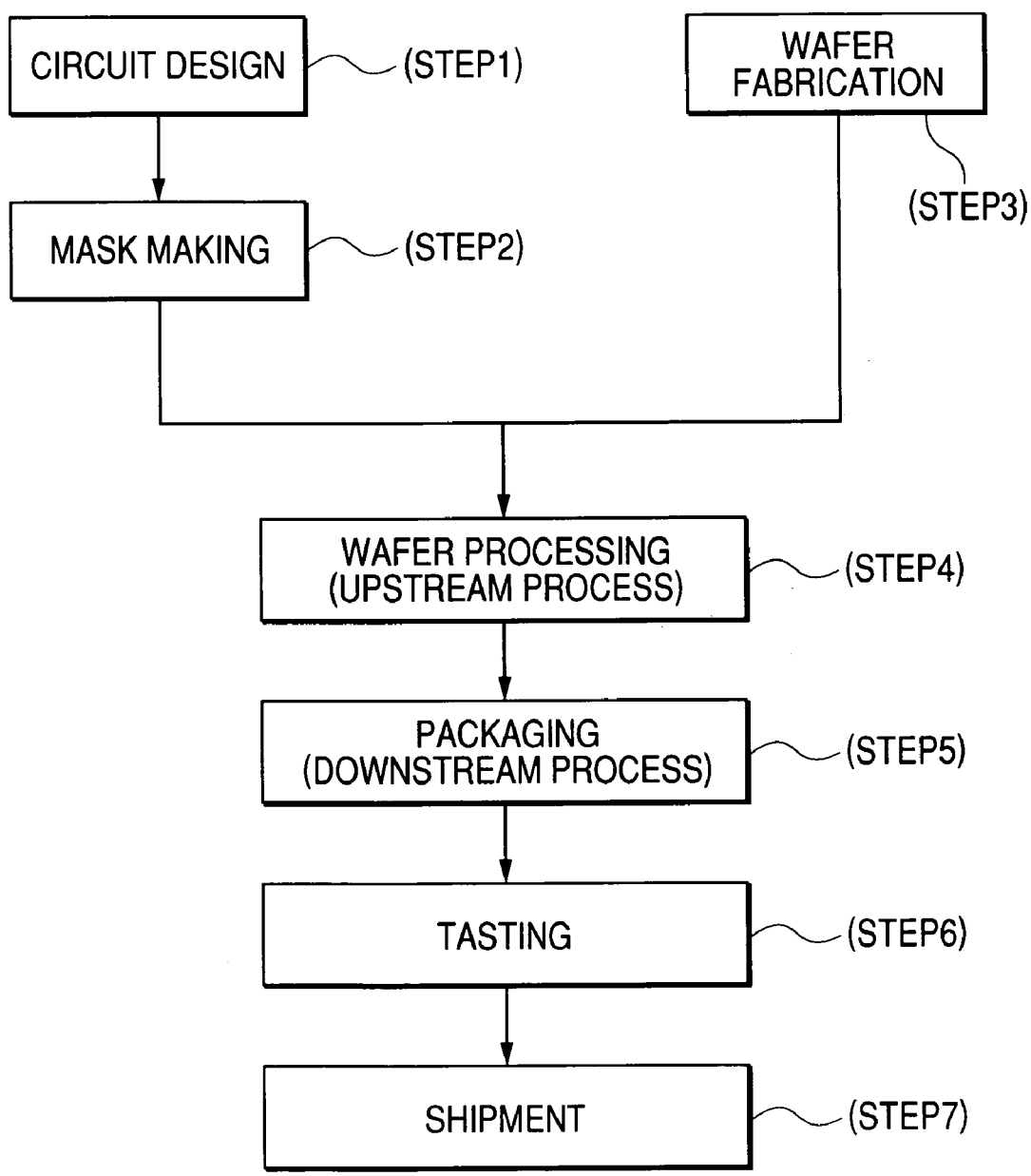
FIG. 6 is a flow chart for illustrating the manufacture of a device (a semiconductor chip such as IC or LSI, LCD, CCD or the like).
Figure 7:
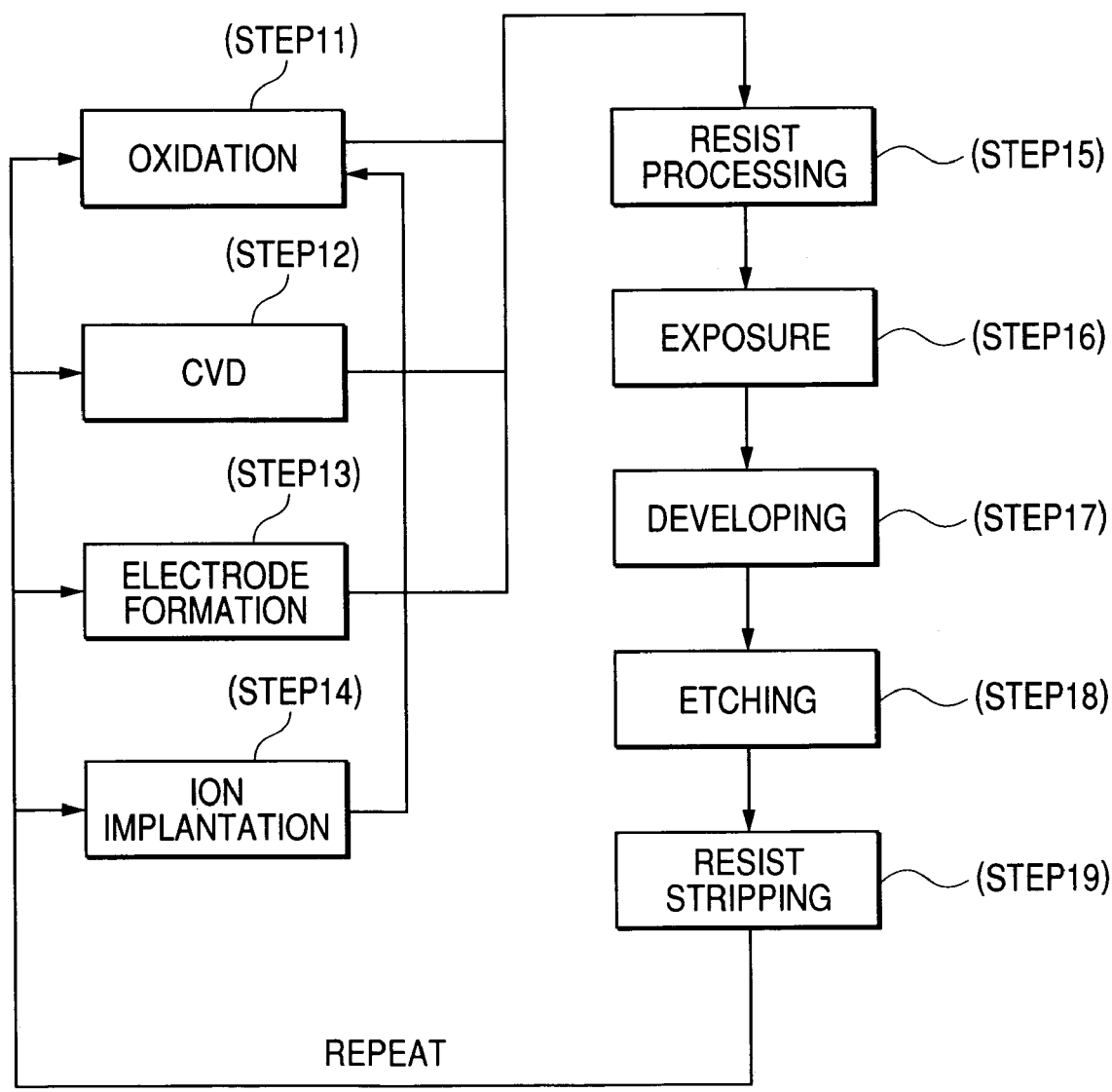
FIG. 7 is a detailed flow chart of the wafer process of a step 4 shown in FIG. 6.

Reference is now had to FIGS. 6 and 7 to describe an embodiment of a device manufacturing method utilizing the above-described exposing apparatus 1, or utilizing an exposing apparatus which carries out the light cleaning method as described above. FIG. 6 is a flow chart for illustrating the manufacture of a device (a semiconductor chip such as IC or LSI, LCD, CCD or the like). In the present embodiment, the manufacture of a semiconductor chip will be described as an example. At a step 1 (circuit design), the circuit design of the device is effected. At a step 2 (mask making), a mask formed with a designed circuit pattern is made. At a step 3 (wafer fabrication), a wafer is fabricated by the use of a material such as silicon. A step 4 (wafer processing) is called an upstream process, in which an actual circuit is formed on the wafer by lithography technique by the use of the mask and the wafer. A step 5 (packaging) is called a downstream process, and is the step of making a semiconductor chip by the use of the wafer prepared by the step 4, and includes such steps as an assembling step (dicing and bonding) and a packaging step (chip enclosing). At a step 6 (testing), such tests as the operation confirming test and durability test of the semiconductor device prepared at the step 5 are carried out. The semiconductor device is completed via such steps, and it is shipped (a step 7).

FIG. 7 is a detailed flow chart of the wafer processing of the step 4. At a step 11 (oxidation), the surface of the wafer is oxidated. At a step 12 (CVD), insulating film is formed on the surface of the wafer. At a step 13 (electrode formation), an electrode is formed on the wafer as by vapor deposition. At a step 14 (ion implantation), ions are implanted into the wafer. At a step 15 (resist processing), a sensitive material is applied to the wafer. At a step 16 (exposure), the wafer is exposed to the circuit pattern of the mask by the exposing apparatus 1. At a step 17 (developing), the exposed wafer is developed. At a step 18 (etching), the other portion than the developed resist image is shaved off. At a step 19 (resist stripping), the resist which has become unnecessary after the etching is removed. By these steps being repetitively executed, circuit patterns are multiplexly formed on the wafer. According to the device manufacturing method of the present invention, a device of high quality can be manufactured at higher throughput than in the prior art. Thus, the device manufacturing method using the lithography technique of the present invention and the device as a result also constitute an aspect of the present invention.

While the preferred embodiments of the present invention have been described above, of course, the present invention is not restricted to these embodiments, but various modifications and changes are possible within the scope of the gist thereof. For example, the projection optical system can be divided by chassis and the cleaning method of the present invention can also be applied thereto. Also, design may be made such that the cleaning gas can be supplied only to the surroundings of the optical members, whereby the optical system need not always be divided by the chassis.

The present embodiment described above can be summed up as follows. The exposing method of the present embodiment is an exposing method of applying ultraviolet light emitted from a light source to an object to be exposed through a first isolated chamber including an optical surface, and a second isolated chamber including an optical surface to thereby expose the object to be exposed to the light, having a first cleaning step of supplying a cleaning gas to the first isolated chamber to thereby clean the optical surface included in the first isolated chamber, and a second cleaning step of supplying a cleaning gas to the second isolated chamber to thereby clean the optical surface included in the second isolated chamber, wherein the start of the first cleaning step is later than the start of the second cleaning step.

The first isolated chamber is disposed at a side nearer to the light source than the second isolated chamber. Further, after the completion of the second cleaning step, the first cleaning step is started. Furthermore, it is desirable that the completion of the second cleaning step be determined on the basis of the time when the second cleaning has been effected.

Also, the cleaning method has an evacuating step of effecting evacuation from the second isolated chamber simultaneously with the first cleaning step. At the first cleaning step, the cleaning gas is supplied into the first isolated chamber and the ultraviolet light is applied to the first isolated chamber, and at the second cleaning step, the cleaning gas is supplied into the second isolated chamber and the ultraviolet light is applied to the second isolated chamber.

Also, both of the gases supplied at the first cleaning step and the second cleaning step are oxygen, and both of the oxygen density in the second isolated chamber at the first cleaning step and the oxygen density in the second isolated chamber at the second cleaning step are 100 ppm or less. Also, both of the gases supplied at the first cleaning step and the second cleaning step are ozone, and both of the ozone density in the first isolated chamber at the first cleaning step and the ozone density in the second isolated chamber at the second cleaning step are 50 ppm or less. Also, in a method according to the present invention, it is desirable that both of the gases supplied at the first cleaning step and the second cleaning step be oxygen, and the oxygen be supplied so that both of the oxygen density in the first isolated chamber at the first cleaning step and the oxygen density in the second isolated chamber at the second cleaning step may be 50 ppm or less. Here, it is desirable that the wavelength of the ultraviolet light be 200 nm or shorter.

Also, the device manufacturing method of the present embodiment is provided with an exposing step of exposing the object to be exposed by light on the basis of the aforedescribed exposing method, and a step of developing the exposed object to be exposed.

Also, the exposing apparatus of the present embodiment is an exposing apparatus for applying ultraviolet light emitted from a light source to an object to be exposed through a first isolated chamber including an optical surface, and a second isolated chamber including an optical surface to expose the object to be cleaned to the light, having first cleaning means for supplying a cleaning gas to the first isolated chamber to thereby clean the optical surface included in the first isolated chamber, and second cleaning means for supplying a cleaning gas to the second isolated chamber to thereby clean the optical surface included in the second isolated chamber, wherein timing at which the cleaning by the second cleaning means is started is later than timing at which the cleaning by the first cleaning means is started.

This application claims priority from Japanese Patent Application No. 2003-403948 filed Dec. 3, 2003, which is hereby incorporated by reference herein.

What is claimed is:

1. An exposing method of applying ultraviolet light emitted from a light source to an object to be exposed through a first isolated chamber including a first optical surface, a second isolated chamber including a second optical surface, and a third isolated chamber including a third optical surface to thereby expose the object to be exposed by the light, comprising:
   a first cleaning step of supplying a cleaning gas to said first isolated chamber to thereby clean the first optical surface;
   a second cleaning step of supplying a cleaning gas to said second isolated chamber to thereby clean the second optical surface; and
   a third cleaning step of supplying a cleaning gas to said third isolated chamber to thereby clean the third optical surface,
   wherein said first isolated chamber is disposed nearer said light source than said second isolated chamber on an optical axis, and said second isolated chamber is disposed nearer said light source than said third isolated chamber on the optical axis, and
   wherein the start of said first cleaning step is later than the start of said second cleaning step and the start of said second cleaning step is later than the start of said third cleaning step.

2. An exposing method according to claim 1, wherein said first cleaning step is started after the completion of said second cleaning step.

3. An exposing method according to claim 1, wherein the completion of said second cleaning step is determined on the basis of a time when said second cleaning has been effected.

4. An exposing method according to claim 1, further comprising an evacuating step of effecting evacuation from said second isolated chamber simultaneously with said first cleaning step.

5. An exposing method according to claim 1, further comprising an evacuating step of effecting evacuation the cleaning gas in the second isolated chamber simultaneously with said first cleaning step.

6. An exposing method according to claim 1,
   further comprising an evacuating step of diluting the cleaning gas in the second isolated chamber simultaneously with said first cleaning step.

7. An exposing method according to claim 1, wherein in said first cleaning step, ultraviolet light for cleaning is applied onto said first optical surface after applying said cleaning gas to said fist isolating chamber, so as to clean said first optical surface, and
   in said second cleaning step, ultraviolet light for cleaning is applied onto said second optical surface after applying said cleaning gas to said second isolating chamber, so as to clean said second optical surface, and
   wherein, said method further comprises a step of, at the same time of applying said cleaning gas to said first isolating chamber, diluting said cleaning in said second isolating chamber.

8. An exposing method according to claim 1, wherein at said first cleaning step, said cleaning gas is supplied into said first isolated chamber and said ultraviolet light is applied to said first isolated chamber, and at said second cleaning step, said cleaning gas is supplied into said second isolated chamber and said ultraviolet light is applied to said second isolated chamber.

9. An exposing method according to claim 1, wherein both of the gases supplied at said first cleaning step and said second cleaning step are oxygen, and both of oxygen density in said first isolated chamber at said first cleaning step and oxygen density in said second isolated chamber at said second cleaning step are 100 ppm or less.

10. An exposing method according to claim 1, wherein both of the gases supplied at said first cleaning step and said second cleaning step are ozone, and both of ozone density in said first isolated chamber at said first cleaning step and oxygen density in said second isolated chamber at said second cleaning step are 50 ppm or less.

11. An exposing method according to claim 1, wherein both of the gases supplied at said first cleaning step and said second cleaning step are oxygen, and the oxygen is supplied so that both of oxygen density in said first isolated chamber at said first cleaning step and oxygen density in said second isolated chamber at said second cleaning step may be 50 ppm or less.

12. An exposing method according to claim 1, wherein the wavelength of said ultraviolet light is 200 nm or shorter.

13. An exposing method according to claim 1,
wherein in said first cleaning step, ultraviolet light for cleaning is applied onto said first optical surface after applying said cleaning gas to said fist isolating chamber, so as to clean said first optical surface, and
in said second cleaning step, ultraviolet light for cleaning is applied onto said second optical surface after applying said cleaning gas to said second isolating chamber, so as to clean said second optical surface, and
wherein said ultraviolet light for cleaning is emitted from said light source.

14. A device manufacturing method comprising:
an exposing step of applying ultraviolet light emitted from a light source to an object to be exposed through a first isolated chamber including a first optical surface, a second isolated chamber including a second optical surface, and a third isolated chamber including a third optical surface to thereby expose the object to be exposed by the light, comprising:
a first cleaning step of supplying a cleaning gas to said first isolated chamber to thereby clean the first optical surface;
a second cleaning step of supplying a cleaning gas to said second isolated chamber to thereby clean the second optical surface; and
a third cleaning step of supplying a cleaning gas to said third isolated chamber to thereby clean the third optical surface,
wherein said first isolated chamber is disposed nearer said light source than said second isolated chamber on an optical axis, and said second isolated chamber is disposed nearer said light source than said third isolated chamber on the optical axis, and
wherein the start of said first cleaning step is later than the start of said second cleaning step and the start of said second cleaning step is later than the start of said third cleaning step; and
a step of developing said exposed object to be processed.

15. An exposing apparatus for applying ultraviolet light emitted from a light source to an object to be exposed through a first isolated chamber including a first optical surface, a second isolated chamber including a second optical surface, and a third isolated chamber including a third optical surface to thereby expose said object to be exposed by the light, having:
a first cleaning member supplying a cleaning gas to said first isolated chamber to thereby clean the first optical surface;
a second cleaning member supplying a cleaning gas to said second isolated chamber to thereby clean the second optical surface; and
a third cleaning member supplying a cleaning gas to said third isolated chamber to thereby clean the third optical surface,
wherein said first isolated chamber is disposed at a side of said apparatus nearer said light source than said second isolated chamber on an optical axis, and said second isolated chamber is disposed at a side of said apparatus nearer said light source than said third isolated chamber on the optical axis, and
wherein the timing at which the cleaning by said first cleaning member is started is later than timing at which the cleaning by said second cleaning member is started and the timing at which the cleaning by said second cleaning member is started is later than timing at which the cleaning by said third cleaning member is started.

16. A device manufacturing method comprising:
a step of exposing an object to be processed by light by the use of an exposing apparatus for applying ultraviolet light emitted from a light source to an object to be exposed through a first isolated chamber including a first optical surface, a second isolated chamber including a second optical surface, and a third isolated chamber including a third optical surface to thereby expose said object to be exposed by the light, having a first cleaning member supplying a cleaning gas to said first isolated chamber to thereby clean the first optical surface, a second cleaning member supplying a cleaning gas to said second isolated chamber to thereby clean the second optical surface, and a third cleaning member supplying a cleaning gas to said third isolated chamber to thereby clean the third optical surface, wherein said first isolated chamber is disposed at a side nearer of said apparatus said light source than said second isolated chamber on an optical axis, and said second isolated chamber is disposed at a side of said apparatus nearer said light source than said third isolated chamber on the optical axis, and wherein the timing at which the cleaning by said first cleaning member is started is later than timing at which the cleaning by said second cleaning member is started and the timing at which the cleaning by said second cleaning member is started is later than timing at which the cleaning by said third cleaning member is started; and
a step of developing said exposed object to be processed.

17. An exposing method of applying ultraviolet light emitted from a light source to an original through a first isolated chamber including a first optical surface, a second isolated chamber including a second optical surface, and a third isolated chamber including a third optical surface to thereby expose a substrate to a pattern of the original, having:
a first cleaning step of supplying a cleaning gas to said first isolated chamber to thereby clean the first optical surface;
a second cleaning step of supplying a cleaning gas to said second isolated chamber to thereby clean the second optical surface; and
a third cleaning step of supplying a cleaning gas to said third isolated chamber to thereby clean the third optical surface,
wherein said first isolated chamber is disposed nearer said light source than said second isolated chamber on an optical axis, and said second isolated chamber is disposed nearer said light source than said third isolated chamber on the optical axis, and
wherein said first, second and third cleaning steps start in succession as follows: said third cleaning step, said second cleaning step, and then said first cleaning step.

18. A device manufacturing method of applying ultraviolet light emitted from a light source to an original through a first isolated chamber including a first optical surface, a second isolated chamber including a second optical surface, and a third isolated chamber including a third optical surface to thereby expose a device to a pattern of the original, comprising:

- a first cleaning step of supplying a cleaning gas to said first isolated chamber to thereby clean the first optical surface;
- a second cleaning step of supplying a cleaning gas to said second isolated chamber to thereby clean the second optical surface; and
- a third cleaning step of supplying a cleaning gas to said third isolated chamber to thereby clean the third optical surface,
- wherein said first isolated chamber is disposed nearer said light source than said second isolated chamber on an optical axis, and said second isolated chamber is disposed nearer said light source than said third isolated chamber on the optical axis, and
- wherein said first, second and third cleaning steps start in succession as follows: said third cleaning step, said second cleaning step, and then said first cleaning step.

19. An exposing apparatus for applying ultraviolet light emitted from a light source to an original through a first isolated chamber including a first optical surface, a second isolated chamber including a second optical surface, and a third isolated chamber including a third optical surface to thereby expose a substrate to a pattern of the original, comprising:

- a first cleaning member supplying a cleaning gas to said first isolated chamber to thereby clean the first optical surface;
- a second cleaning member supplying a cleaning gas to said second isolated chamber to thereby clean the second optical surface; and
- a third cleaning member supplying a cleaning gas to said third isolated chamber to thereby clean the third optical surface,
- wherein said first isolated chamber is disposed at a side of said apparatus nearer said light source than said second isolated chamber on an optical axis, and said second isolated chamber is disposed at a side of said apparatus nearer said light source than said third isolated chamber on the optical axis, and
- wherein the cleanings by said first, second and third cleaning members start in succession as follows: the cleaning by said third cleaning members, the cleaning by said second cleaning member, and then the cleaning by said first cleaning member.

* * * * *

UNITED STATES PATENT AND TRADEMARK OFFICE
CERTIFICATE OF CORRECTION

| | |
|---|---|
| PATENT NO. | : 7,251,014 B2 |
| APPLICATION NO. | : 10/998905 |
| DATED | : July 31, 2007 |
| INVENTOR(S) | : Hase |

It is certified that error appears in the above-identified patent and that said Letters Patent is hereby corrected as shown below:

COLUMN 2:
Line 10, "n an exposing" should read --in an exposing--.
Line 15, "not only" should read --not only in--.
Line 16, "also" should read --also in--.
Line 48, "in case" should read --in the case--.

COLUMN 4:
Line 64, delete "over".

COLUMN 5:
Line 24, "other object" should read --other objects--.

COLUMN 6:
Line 13, "have" should read --has--.

COLUMN 12:
Line 39, claim 6 "evacuation" should read --evacuation of--.
Line 43, claim 6 "fist isolating;" should read --first isolated--.
Line 47, claim 7 "isolating" should read --isolated--.
Line 51, claim 7 "isolating" should read --isolated--.
Line 52, claim 7 "isolating" should read --isolated--; and "cleaning" should read --cleaning step--.

COLUMN 13:
Line 17, claim 13 "fist isolating" should read --first isolated--.
Line 21, claim 13 "isolating" should read --isolated--.

COLUMN 14:
Line 30, claim 16 "nearer" should be deleted and "apparatus" should read --apparatus nearer--.

UNITED STATES PATENT AND TRADEMARK OFFICE
CERTIFICATE OF CORRECTION

PATENT NO.        : 7,251,014 B2
APPLICATION NO.   : 10/998905
DATED             : July 31, 2007
INVENTOR(S)       : Hase It is certified that error appears in the above-identified patent and that said Letters Patent is hereby corrected as shown below:

<u>COLUMN 16</u>:
Line 21, claim 19 "members, the" should read --member, the--.

Signed and Sealed this

Second Day of June, 2009

JOHN DOLL
*Acting Director of the United States Patent and Trademark Office*